(12) United States Patent
Yamamoto et al.

(10) Patent No.: US 10,608,166 B2
(45) Date of Patent: Mar. 31, 2020

(54) METHOD FOR MANUFACTURING A PIEZOELECTRIC DEVICE

(71) Applicant: Murata Manufacturing Co., Ltd., Nagaokakyo-shi, Kyoto-fu (JP)

(72) Inventors: Kansho Yamamoto, Nagaokakyo (JP); Takuo Hada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 190 days.

(21) Appl. No.: 15/641,470

(22) Filed: Jul. 5, 2017

(65) Prior Publication Data
US 2017/0309811 A1 Oct. 26, 2017

Related U.S. Application Data

(63) Continuation of application No. PCT/JP2016/050122, filed on Jan. 5, 2016.

(30) Foreign Application Priority Data

Jan. 13, 2015 (JP) .................................. 2015-004082

(51) Int. Cl.
*H04R 17/00* (2006.01)
*H01L 41/29* (2013.01)
(Continued)

(52) U.S. Cl.
CPC .......... *H01L 41/29* (2013.01); *H01L 41/0805* (2013.01); *H01L 41/09* (2013.01);
(Continued)

(58) Field of Classification Search
CPC ....... H01L 41/09; H01L 41/113; H01L 41/23; H01L 41/253; H01L 41/39; H01L 41/314;
(Continued)

(56) References Cited

U.S. PATENT DOCUMENTS

| | | | |
|---|---|---|---|
| 5,696,423 | A | 12/1997 | Dydyk et al. |
| 7,745,975 | B2 | 6/2010 | Asai et al. |

(Continued)

FOREIGN PATENT DOCUMENTS

| | | |
|---|---|---|
| JP | S60-149215 A | 8/1985 |
| JP | H05-40126 A | 2/1993 |

(Continued)

OTHER PUBLICATIONS

Japanese Office Action issued for Japanese application 2016-569309, dated May 29, 2018.

(Continued)

*Primary Examiner* — Paul D Kim
(74) *Attorney, Agent, or Firm* — Arent Fox LLP

(57) ABSTRACT

A method for manufacturing a piezoelectric device that includes a substrate, a piezoelectric layer directly or indirectly supported by the substrate and arranged above the substrate, a heater, and a heater electrode for driving the heater. Moreover, the method includes forming the piezoelectric layer, the heater, and the heater electrode and subjecting the piezoelectric device to heat treatment with heat generated from the heater by driving the heater by feeding electric power to the heater electrode.

12 Claims, 15 Drawing Sheets

(51) Int. Cl.
*H01L 41/253* (2013.01)
*H01L 41/113* (2006.01)
*H01L 41/39* (2013.01)
*H01L 41/09* (2006.01)
*H03H 3/02* (2006.01)
*H01L 41/23* (2013.01)
*H03H 9/58* (2006.01)
*H03H 9/17* (2006.01)
*H05B 3/26* (2006.01)
*H01L 41/08* (2006.01)
*H01L 41/332* (2013.01)
*H01L 41/338* (2013.01)
*H05B 3/03* (2006.01)
*H03H 9/02* (2006.01)
*H03H 3/04* (2006.01)
*H01L 41/314* (2013.01)

(52) U.S. Cl.
CPC .......... *H01L 41/113* (2013.01); *H01L 41/23* (2013.01); *H01L 41/253* (2013.01); *H01L 41/332* (2013.01); *H01L 41/338* (2013.01); *H01L 41/39* (2013.01); *H03H 3/02* (2013.01); *H03H 9/174* (2013.01); *H03H 9/583* (2013.01); *H05B 3/03* (2013.01); *H05B 3/26* (2013.01); *H01L 41/314* (2013.01); *H03H 2003/0414* (2013.01); *H03H 2009/02181* (2013.01)

(58) Field of Classification Search
CPC ... H01L 41/0805; H01L 41/29; H01L 41/332; H01L 41/338; H03H 3/02; H03H 9/174; H03H 9/583; H05B 3/26; H05B 3/03
See application file for complete search history.

(56) References Cited

U.S. PATENT DOCUMENTS

| | | | |
|---|---|---|---|
| 7,965,017 B2* | 6/2011 | Iwashita | H03H 3/02 310/321 |
| 2005/0028336 A1 | 2/2005 | Robert et al. | |
| 2008/0169728 A1 | 7/2008 | Asai et al. | |
| 2009/0322186 A1 | 12/2009 | Iwashita et al. | |
| 2010/0134209 A1 | 6/2010 | Gabl | |
| 2010/0195851 A1 | 8/2010 | Buccafusca et al. | |

FOREIGN PATENT DOCUMENTS

| | | |
|---|---|---|
| JP | H10-256570 A | 9/1998 |
| JP | 2001-85752 A | 3/2001 |
| JP | 2004060033 A | 2/2004 |
| JP | 2005-327934 A | 11/2005 |
| JP | 2008-172713 A | 7/2008 |
| WO | WO 2008/032543 A1 | 3/2008 |

OTHER PUBLICATIONS

International Search Report issued in International Application No. PCT/JP2016/050122, dated Feb. 16, 2016 (with English Translation).
S. Shelton et al., CMOS-Compatible AlN Piezoelectric Micromachined Ultrasonic Transducers, 2009 IEEE International Ultrasonics Symposium Proceedings, pp. 402-405.
Written Opinion of the International Searching Authority issued in International Application No. PCT/JP2016/050122, dated Feb. 16, 2016 (with English Translation).

* cited by examiner

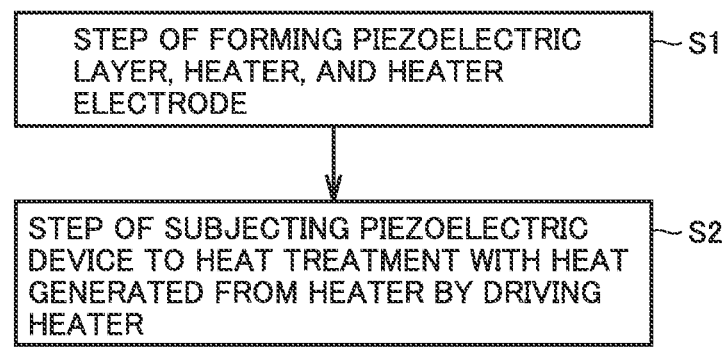
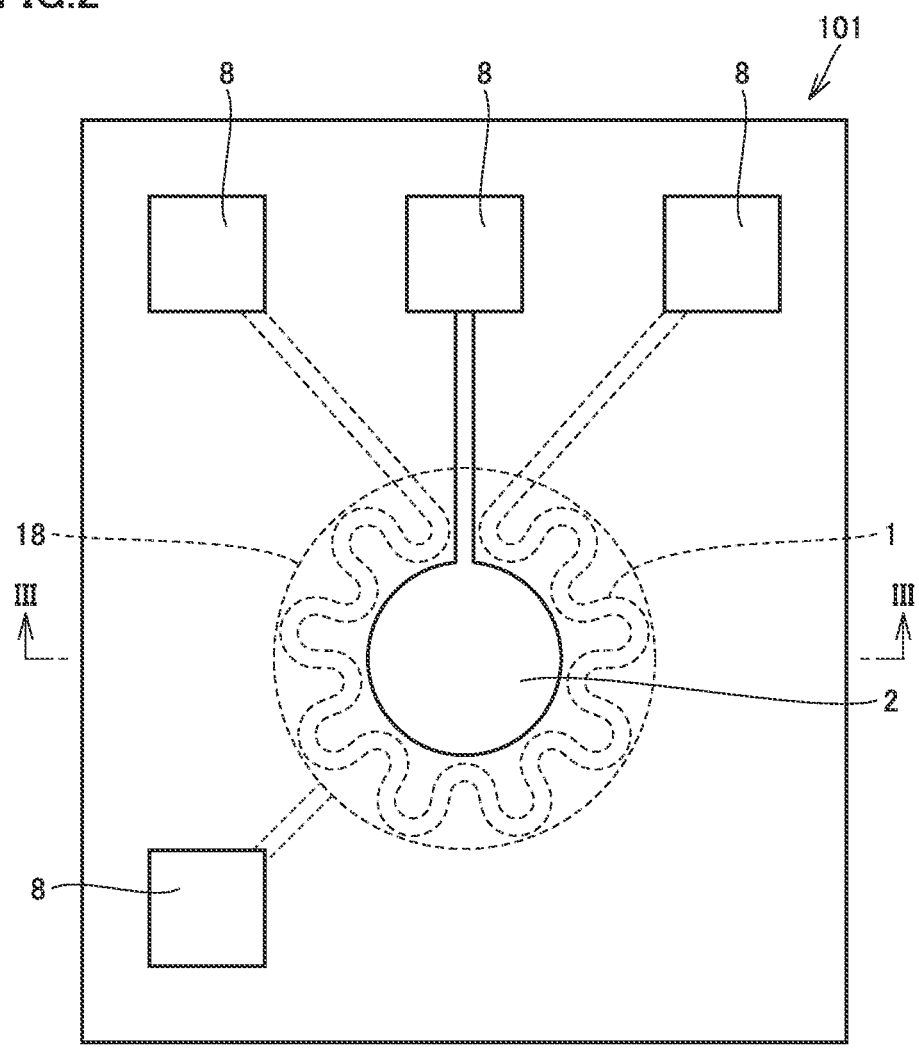

METHOD FOR MANUFACTURING A PIEZOELECTRIC DEVICE

CROSS REFERENCE TO RELATED APPLICATIONS

The present application is a continuation of PCT/JP2016/050122 filed Jan. 5, 2016, which claims priority to Japanese Patent Application No. 2015-004082, filed Jan. 13, 2015, the entire contents of each of which are incorporated herein by reference.

TECHNICAL FIELD

The present disclosure relates to a method for manufacturing a piezoelectric device.

BACKGROUND

As disclosed in "CMOS-Compatible AlN Piezoelectric Micromachined Ultrasonic Transducers," Stefon Shelton et al., 2009 IEEE International Ultrasonics Symposium Proceedings, pp. 402-405 (hereinafter "non-patent document 1"), a piezoelectric device including a substrate and a piezoelectric layer and an electrode which are provided above the substrate has conventionally been known. Such a piezoelectric device is used for a filter, an actuator, a sensor, and a pMUT (piezoelectric Micromachined Ultrasonic Transducers).

U.S. Patent Publication No. 2010/0195851A1 (hereinafter "patent document 1") discloses in paragraphs 0017 to 0023 and FIGS. 1A and 1B, a MEMS device including a transducer, a substrate, and a temperature compensating element as one example of such a piezoelectric device. The transducer is, for example, a piezoelectric ultrasonic transducer which vibrates in a flexural mode and is arranged above the substrate. The temperature compensating element is, for example, a heater element, and it is arranged on the substrate around the transducer on a lower surface side thereof.

U.S. Patent Publication No. 2010/0134209A1 (hereinafter "patent document 2") discloses in paragraphs 0070 to 0076 and FIGS. 2A and 2B, a sensor array including a sensor element, a semiconductor substrate, and a heater element. The sensor element is a piezoelectric resonance element having a piezoelectric layer and two electrodes and arranged on the substrate. The heater element is arranged around the sensor element on the substrate.

The heater element described in these documents is used for adjusting a temperature of a piezoelectric device for stabilizing an oscillation frequency and removing moisture which is attached to a surface of the piezoelectric device.

Such a piezoelectric device is disadvantageous in great variation in resonance frequency (hereinafter also referred to as "frequency variation") caused during manufacturing. There are some factors determining frequency variation such as a dimension including a thickness and a length of the device. In particular, the most important factor is a stress in a member forming a membrane portion. A member forming the membrane portion includes a piezoelectric layer and an electrode.

A stress in the member forming the membrane portion may vary depending on a manufacturing method such as a sputtering method or a sol-gel method. A piezoelectric layer composed of AlN is often formed with the sputtering method. When the piezoelectric layer composed of AlN is formed with the sputtering method, a stress in the piezoelectric layer may greatly vary in a wafer plane due to a temperature distribution in a substrate or a plasma distribution. Consequently, frequency variation of the piezoelectric device is great.

Japanese Patent Laying-Open No. 2001-85752 (hereinafter "patent document 3") discloses heat treatment in a heat treatment furnace for mitigating a stress in a functional film in a semiconductor sensor. In the heat treatment in the heat treatment furnace, however, the entire piezoelectric device is heated with a temperature of the heat treatment furnace being increased to a desired temperature, and hence the heat treatment is disadvantageous in time and cost.

Japanese Patent Laying-Open No. 10-256570 (hereinafter "patent document 4") discloses formation of a thin film formed of a piezoelectric material while a substrate is heated with a local heating portion as a heater element formed on the substrate in order to form a thin film excellent in characteristics in a thin-film device. A temperature distribution in a substrate or a plasma distribution in the sputtering method, however, affects magnitude of a stress in the piezoelectric layer composed of AlN, and hence great frequency variation caused during manufacturing is not necessarily overcome even by this method.

SUMMARY

An object of the present disclosure is to provide a method for manufacturing a piezoelectric device with reduced frequency variation.

In order to achieve the object, a method for manufacturing a piezoelectric device is disclosed where the piezoelectric device includes a substrate, a piezoelectric layer directly or indirectly supported by the substrate and arranged above the substrate, a heater, and a heater electrode for driving the heater. Moreover, the method includes forming the piezoelectric layer, the heater, and the heater electrode and subjecting the piezoelectric device to heat treatment with heat generated from the heater by driving the heater by feeding electric power to the heater electrode.

The exemplary method preferably includes measuring a resonance frequency, and subjecting the piezoelectric device to heat treatment by driving the heater with a frequency being adjusted based on a result of measurement in the measuring a resonance frequency.

The exemplary method preferably includes measuring a resonance frequency again after the subjecting the piezoelectric device to heat treatment.

In an exemplary embodiment, preferably, at least a part of the piezoelectric layer serves as a membrane portion not superimposed on the substrate and the piezoelectric layer includes a lower electrode arranged under the piezoelectric layer at least in the membrane portion and an upper electrode arranged above the piezoelectric layer as being opposed to at least a part of the lower electrode with the piezoelectric layer being interposed in the membrane portion, and the heater is arranged in the membrane portion.

In an exemplary embodiment, preferably, a protective film is provided to cover the upper electrode and the piezoelectric layer.

In an exemplary embodiment, preferably, the substrate is provided with a through hole or a recess, the substrate includes a support layer so as to cover the through hole or the recess, and the piezoelectric layer is supported by the substrate with the support layer being interposed.

In an exemplary embodiment, preferably, the piezoelectric layer is mainly composed of any selected from the group consisting of AlN, KNN, and PZT.

In an exemplary embodiment, preferably, the protective film is mainly composed of AlN.

In an exemplary embodiment, preferably, the support layer is mainly composed of AlN.

In an exemplary embodiment, preferably, the heater electrode is mainly composed of W or Mo.

According to the present disclosure, since a piezoelectric device is subjected to heat treatment with a heater formed in the piezoelectric device, a thermal capacity is low and heat treatment can be performed in an extreme short period of time. Since a resonance frequency can be adjusted at a desired location to a desired extent through the heat treatment, frequency variation can be lessened.

BRIEF DESCRIPTION OF DRAWINGS

FIG. 1 is a flowchart of a method for manufacturing a piezoelectric device in an exemplar embodiment 1.

FIG. 2 is a plan view of a piezoelectric device manufactured with the method for manufacturing a piezoelectric device in an exemplar embodiment 1.

DETAILED DESCRIPTION

Embodiment 1

A method for manufacturing a piezoelectric device in an exemplary Embodiment 1 will be described with reference to FIGS. 1 to 8. FIG. 1 shows a flowchart of a method for manufacturing a piezoelectric device in the present embodiment.

The method for manufacturing a piezoelectric device in the present embodiment is a method for manufacturing a piezoelectric device including a substrate, a piezoelectric layer directly or indirectly supported by the substrate and arranged above the substrate, a heater, and a heater electrode for driving the heater. As shown, the exemplary method includes a step S1 of forming the piezoelectric layer, the heater, and the heater electrode and a step S2 of subjecting the piezoelectric device to heat treatment with heat generated from the heater by driving the heater by feeding electric power to the heater electrode.

Figure 3:
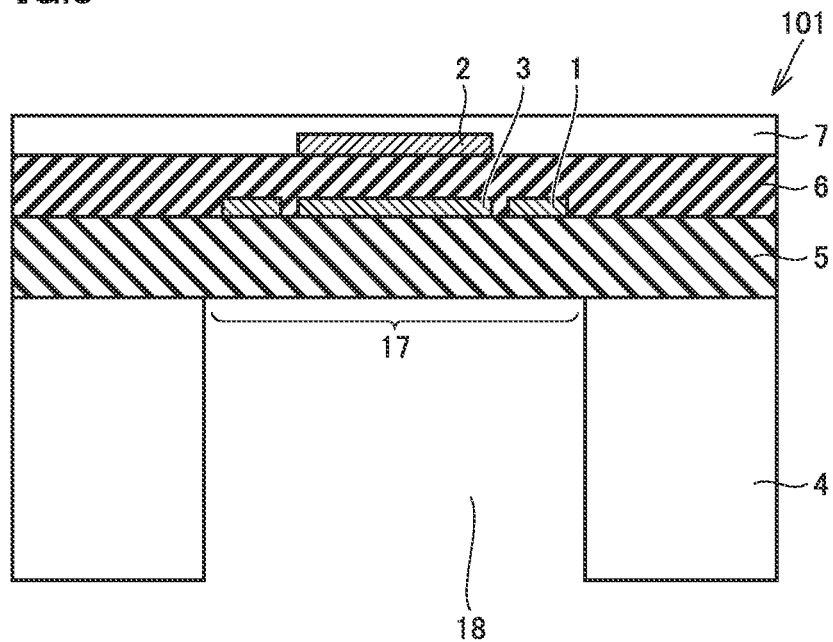
FIG. 3 is a cross-sectional view along the line in FIG. 2.

FIGS. 2 and 3 show one example of a piezoelectric device manufactured with the method for manufacturing a piezoelectric device in the present embodiment. FIG. 3 is a cross-sectional view along the line III-III in FIG. 2. For the sake of convenience of illustration, FIG. 2 shows a state with a protective film 7 having been removed. Even while protective film 7 is provided, protective film 7 is provided with an opening over each pad portion 8 and electrical connection to pad portion 8 can be established even from above protective film 7. This piezoelectric device 101 is used, for example, as a pMUT. In the exemplary method for manufacturing a piezoelectric device in the present embodiment, each step below for manufacturing piezoelectric device 101 is performed.

Figure 4:
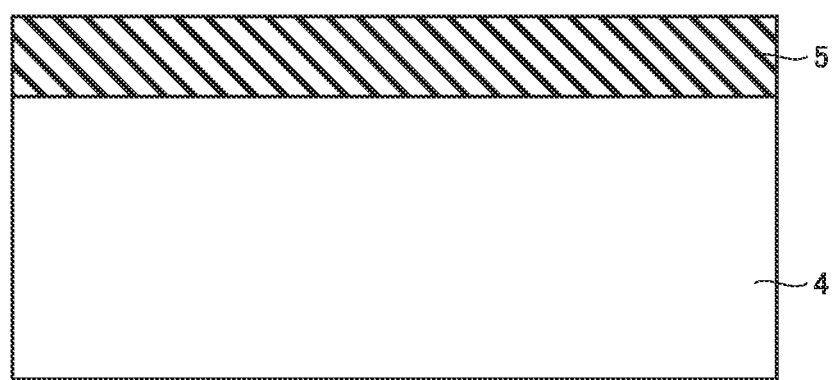
FIG. 4 is a diagram illustrating a first step in the method for manufacturing a piezoelectric device in an exemplar embodiment 1.
Figure 5:
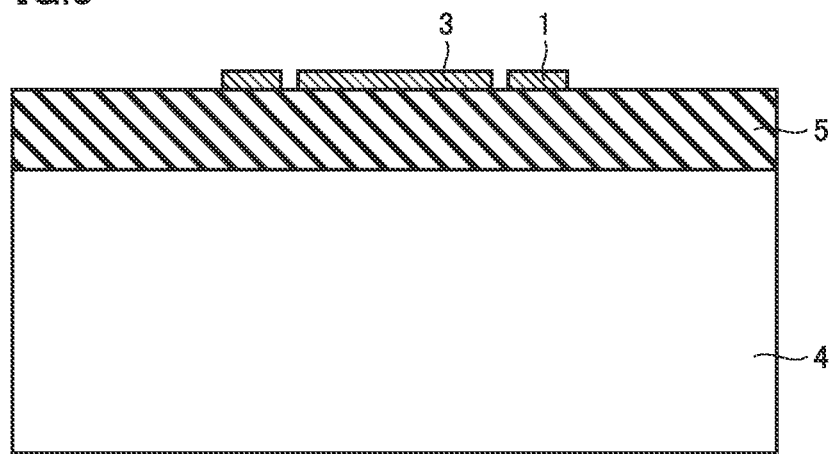
FIG. 5 is a diagram illustrating a second step in the method for manufacturing a piezoelectric device in an exemplar embodiment 1.
Figure 6:
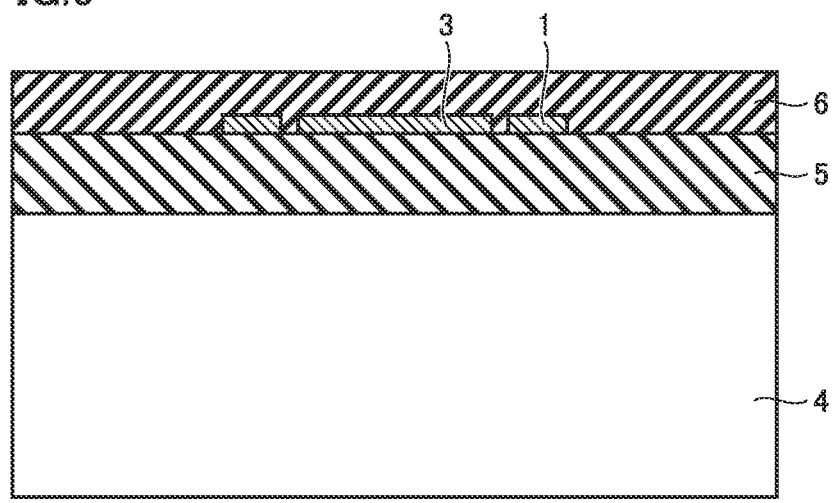
FIG. 6 is a diagram illustrating a third step in the method for manufacturing a piezoelectric device in an exemplar embodiment 1.
Figure 7:
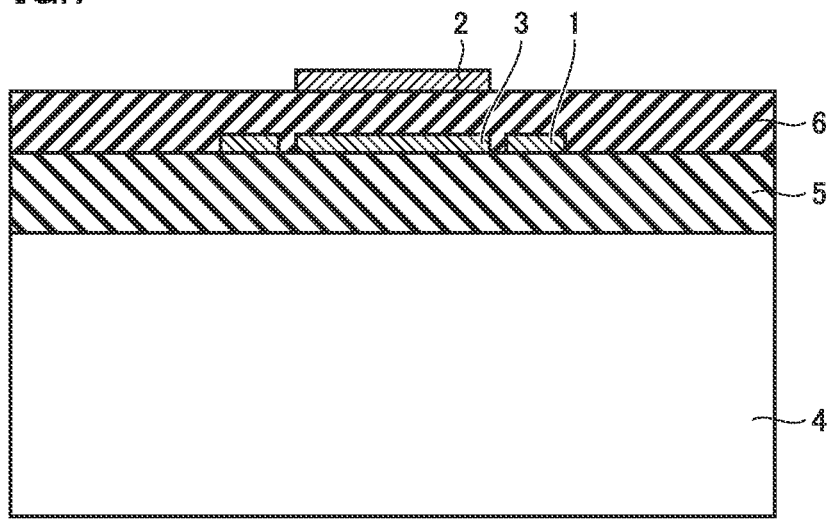
FIG. 7 is a diagram illustrating a fourth step in the method for manufacturing a piezoelectric device in an exemplar embodiment 1.
Figure 8:
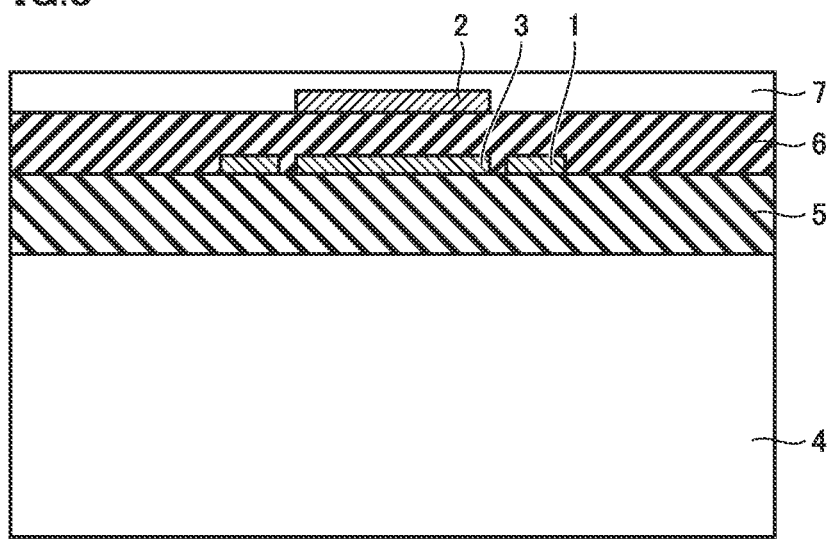
FIG. 8 is a diagram illustrating a fifth step in the method for manufacturing a piezoelectric device in an exemplar embodiment 1.

Initially, as shown in FIG. 4, an AlN film as a support layer 5 is formed with the sputtering method to a thickness not smaller than 500 nm and not greater than 3000 nm on a silicon substrate as a substrate 4. In succession, a molybdenum film is formed to a thickness not smaller than 100 nm and not greater than 200 nm to cover an upper surface of support layer 5 and the molybdenum film is patterned. Thus, as shown in FIG. 5, a heater 1 and a drive-and-reception lower electrode 3 are formed on the support layer 5. Moreover, heater 1 is preferably formed in a meandering shape so as to surround drive-and-reception lower electrode 3. In succession, as shown in FIG. 6, an AlN film to be a piezoelectric layer 6 is formed with the sputtering method to a thickness not smaller than 500 nm and not greater than 3000 nm and patterned as necessary. In succession, as shown in FIG. 7, a molybdenum film is formed and patterned. Thus, a drive-and-reception upper electrode 2 is formed. In succession, an AlN film to be protective film 7 is formed to a thickness not smaller than 100 nm and not greater than 1000 nm. According to the claimed method, a structure is obtained as shown in FIG. 8.

In forming an AlN film or a molybdenum film as an electrode as shown above, a stress in a formed film has an in-plane distribution because there is a temperature distribution in substrate 4 and a plasma density during sputtering has a distribution over a surface of the substrate. This distribution generally exhibits an in-plane difference not lower than 100 MPa. When a formed film is assumed to have a stress of 100 MPa, a resonance frequency of an element which exhibits out-of-plane vibration like a pMUT is varied because a membrane is compressed or pulled under the influence by the stress. For example, even though a resonance frequency is designed to be 300 kHz, the resonance frequency will vary, for example, from 250 kHz to 500 kHz in the plane.

In succession, protective film 7 and piezoelectric film 6 are etched to expose an electrode in a portion to be pad portion 8. In a portion where an electrode is exposed as pad portion 8 (not shown), an aluminum film is formed to cover the electrode.

In succession, substrate 4 is etched from a rear surface of substrate 4 until support layer 5 is reached. A structure shown in FIGS. 2 and 3 is thus obtained. A through hole 18 is provided in substrate 4 and a portion which remains above through hole 18 serves as a membrane portion 17.

Until this time point, however, the piezoelectric device has great variation in stress and consequently great frequency variation in each formed layer as described above.

In succession, pad portion 8 connected to heater 1 is used to feed electric power to heater 1. As a result, the meandering heater 1 generates heat and the heat treatment of membrane portion 17 can be performed with this heat generation. This heat treatment can be considered an "annealing treatment." Since heater 1 is extremely low in thermal capacity, heating to 500° C. to 900° C. or to 900° C. or higher can rapidly be achieved in an extremely short period of time less than one second once electric power approximately from 100 mW to 1000 mW is fed. A target temperature is set to a temperature not lower than a film formation temperature in sputtering for film formation, preferably a temperature not lower than 900° C. As such heat treatment ends, piezoelectric device 101 is obtained.

In the present embodiment, membrane portion 17 is subjected to heat treatment by feeding electric power to heater 1 to generate heat. By heating membrane portion 17 to a film formation temperature or higher, crystallinity of an AlN film or an Mo film is improved. Specifically, an Ar gas taken in as an impurity in the film is released from the film, or atoms of Al or Mo located between lattices are re-arranged to appropriate positions. A shape as a membrane has already been achieved also in a process for cooling after heat treatment, and hence a thermal stress between the membrane portion and substrate 4 is not much applied and consequently a pMUT having greatly improved initial frequency variation can be fabricated.

Since heating is performed with heater 1 formed in membrane portion 17 in the present embodiment, a thermal capacity is low and heat treatment can be performed in an extremely short period of time. In addition, a resonance frequency can be adjusted through heat treatment in a form as a final product or in a state close thereto in the present embodiment. Since local heating can be performed in the present embodiment, a desired location can properly be subjected to heat treatment even though a material low in heat resistance such as an aluminum alloy in pad portion 8 or an adhesive used for die-bonding is located nearby.

Since a desired location can be subjected to heat treatment to a desired extent as described above according to the method for manufacturing a piezoelectric device in the present embodiment, frequency variation can be reduced.

As shown in the present embodiment, an electrode for driving and reception (e.g., drive-and-reception upper electrode 2 and/or lower electrode 3 described below) and an electrode for a heater (e.g., heater 1), that is, a heater electrode, can separately be provided, and according to such a configuration, a function for driving and reception as a pMUT and a function as a heater can independently be used by separate electrodes.

In membrane portion 17, heater 1 and an electrode for driving and reception as a pMUT are arranged at separate positions and do not interfere with each other.

Though one piezoelectric device may be capable of both of transmission and reception, piezoelectric devices separately for transmission and reception may be prepared as one pair of piezoelectric devices consisting of a transmission piezoelectric device and a reception piezoelectric device. In this case, variation in sensitivity in this pair gives rise to a problem. Variation in resonance frequency, however, is lessened by performing heat treatment in the present embodiment, and therefore variation in sensitivity in the pair can also be lessened.

In the present embodiment, membrane portion 17 can be heated to 900° C. or higher.

In heating to 900° C. or higher, in order to prevent oxidation of an AlN film, heating is preferably performed in an $N_2$ atmosphere. Even in heating to 900° C. or higher, piezoelectric performance is not impaired because AlN and Mo are close to each other in linear coefficient of expansion, AlN and Mo have an extremely high melting point, and an AlN film has an extremely high Curie temperature not lower than 1000° C. Therefore, performance as a pMUT is not impaired. By bringing a ratio of a thickness between a piezoelectric film and a support film as close as possible to 1:1, deformation or destruction of membrane portion 17 due to a thermal stress can be suppressed.

Though an example in which an AlN film is employed as piezoelectric layer 6 is shown in the present embodiment, piezoelectric layer 6 is not limited to the AlN film. Piezoelectric layer 6 may be formed, for example, from a ZnO film or an AlN film doped with Sc.

Though the present embodiment shows an example in which heater 1 is arranged on the upper surface of support layer 5, limitation to the configuration is not intended. Alternatively, heater 1 may be arranged on an upper surface of piezoelectric layer 6.

A material for support layer 5 and protective film 7 is not limited to AlN and a material close in linear coefficient of expansion to AlN may be employed. For example, support layer 5 and protective film 7 can be silicon or SiN in one exemplary aspect.

A plurality of piezoelectric devices are normally simultaneously manufactured. In this case, a process proceeds concurrently for a plurality of piezoelectric devices. Conventionally, a resonance frequency may be varied also among the plurality of concurrently treated and manufactured piezoelectric devices. In the present embodiment, however, frequency variation among the plurality of simultaneously manufactured piezoelectric devices can be suppressed by individually measuring a resonance frequency of the plurality of piezoelectric devices at a room temperature before heat treatment and individually subjecting the piezoelectric devices to heat treatment in accordance with a difference between the resonance frequency of each piezoelectric device and a target resonance frequency (a temperature and a time period).

In feeding electric power to heater 1, frequency variation can also be suppressed by repeating a cycle of measurement of a resonance frequency→heat treatment→measurement of a resonance frequency→heat treatment→ . . . at a room temperature in order to obtain a desired frequency in individual piezoelectric devices. By adopting such a method, a plurality of piezoelectric devices among which frequency variation is further lessened can be formed in a short period of time.

The method for manufacturing a piezoelectric device in the present embodiment includes a step of measuring a resonance frequency, and in the step of subjecting the piezoelectric device to heat treatment, where the heater is preferably driven with a frequency being adjusted based on a result of measurement in the step of measuring a resonance frequency. By doing so, information on a result of actual measurement can be used so that the heater can be driven in a more appropriate condition.

The method for manufacturing a piezoelectric device in the present embodiment preferably includes a step of measuring a resonance frequency again after the step of subjecting the piezoelectric device to heat treatment. By doing so, a resonance frequency changed by heat treatment can be known so that whether or not the resonance frequency has attained to a desired value can be checked. When heat treatment is further repeated, the heater can be driven in a more appropriate condition by using information on a value of the resonance frequency after previous heat treatment.

Since the step of heat treatment and the step of measuring a resonance frequency can thus be repeated in the present embodiment, a resonance frequency of a piezoelectric device can be adjusted to a desired frequency.

Figure 9:
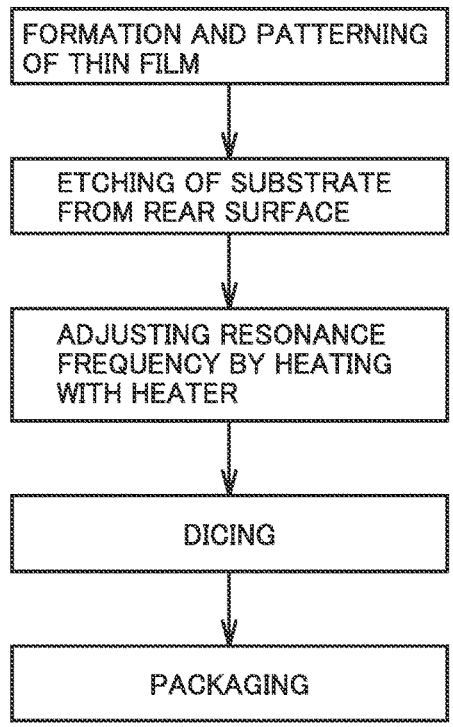
FIG. 9 shows a first example of a flowchart including a step of adjusting a resonance frequency by heating with a heater.
Figure 10:
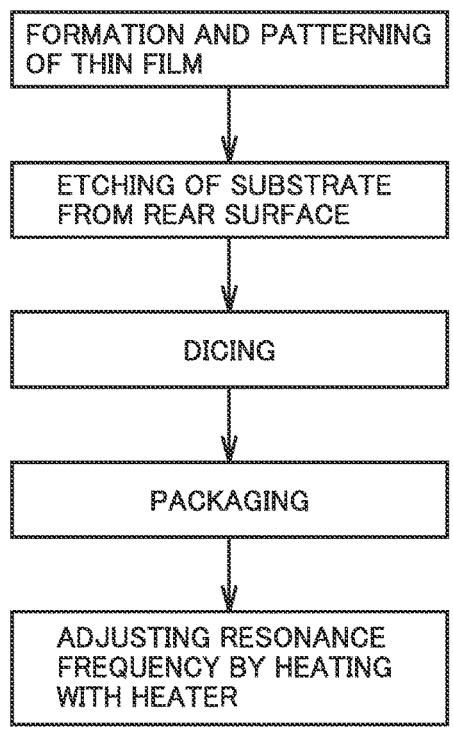
FIG. 10 shows a second example of a flowchart including the step of adjusting a resonance frequency by heating with a heater.

Though the step of thus adjusting a resonance frequency by heating with the heater may be performed after a step of etching a substrate and before dicing as shown in FIG. 9, it may be performed after a packaging step is completed as shown in FIG. 10. "Formation and patterning of thin film" in FIGS. 9 and 10 means that a structure on substrate 4 is obtained by repeating film formation and patterning. "Etching of substrate" means a step of providing through hole 18 by etching substrate 4 from the rear surface to thereby form membrane portion 17. "Dicing" means a step of division into individual piezoelectric devices in an example of fabrication of a plurality of piezoelectric devices on one large substrate.

Embodiment 2

A method for manufacturing a piezoelectric device in an exemplary Embodiment 2 will be described with reference again to FIGS. 2 and 3. Though a structure itself of the piezoelectric device in the present embodiment is the same as described in Embodiment 1, a material is mainly different as described below. The reference numerals in FIGS. 2 and 3 are used in the text.

In the present embodiment, a perovskite ferroelectric such as potassium sodium niobate (KNN: (K, Na)NbO$_3$) or lead zirconate titanate (PZT: Pb(Zr, Ti)O$_3$) is used as a material for piezoelectric layer 6. In the present embodiment, a silicon on insulator (SOI) substrate is used as a component forming substrate 4 and support layer 5. The SOI substrate is structured such that a silicon layer, an oxide film, and an active layer are successively stacked from below. The active layer is composed of silicon.

In the present embodiment, the active layer of the SOI substrate is used as support layer 5. The active layer composed of Si has a thickness not smaller than 2 μm and not greater than 10 μm. A lower electrode formed from a stack film of Pt/Ti is formed on the SOI substrate to approximately 100 nm and patterned to form heater 1 and drive-and-reception lower electrode 3. On these elements, a PZT film is formed to a thickness of 1000 nm to 3000 nm through sputtering at a substrate temperature around 600° C. On this element, an upper electrode composed of Pt/Ti is formed. Since Pt is resistant to oxidation, a protective film is not particularly required. Though piezoelectric device 101 shown in FIG. 3 is provided with protective film 7, the piezoelectric device in the present embodiment is not provided with protective film 7. When a Pt film included in the upper electrode and a PZT film are formed with the sputtering method, the SOI substrate will have a great in-plane stress distribution for reasons the same as those for AlN. Even though a PZT film is formed with other techniques such as a sol-gel method as well, the SOI substrate will have an in-plane distribution of a firing temperature and hence will have a stress distribution. Though the present embodiment shows an example in which the active layer composed of Si is employed as the support layer, a layer composed of PZT instead of Si may be employed as the active layer.

In succession, the silicon layer of the SOI substrate is etched from the rear surface until the oxide film is reached. Thereafter, the oxide film is removed as necessary.

Thereafter, heat treatment is performed by feeding electric power to heater 1 formed from the stack film of Pt/Ti. In this case, heat treatment is preferably performed at a temperature approximately not lower than 700° C. and not higher than 1000° C. which is a temperature not lower than a film formation temperature. Since a temperature for heat treatment exceeds a Curie point, polarization treatment is required for use as a pMUT. Then, polarization treatment for aligning orientations of polarization of piezoelectric layer 6 is performed by applying an appropriate voltage across the electrodes formed for driving and reception on upper and lower surfaces of piezoelectric layer 6.

The present embodiment can also obtain an effect the same as in Embodiment 1. Since a material higher in piezoelectric characteristics than AlN is employed in the present embodiment, a piezoelectric device with good piezoelectric characteristics can be obtained.

Embodiment 3

Figure 11:
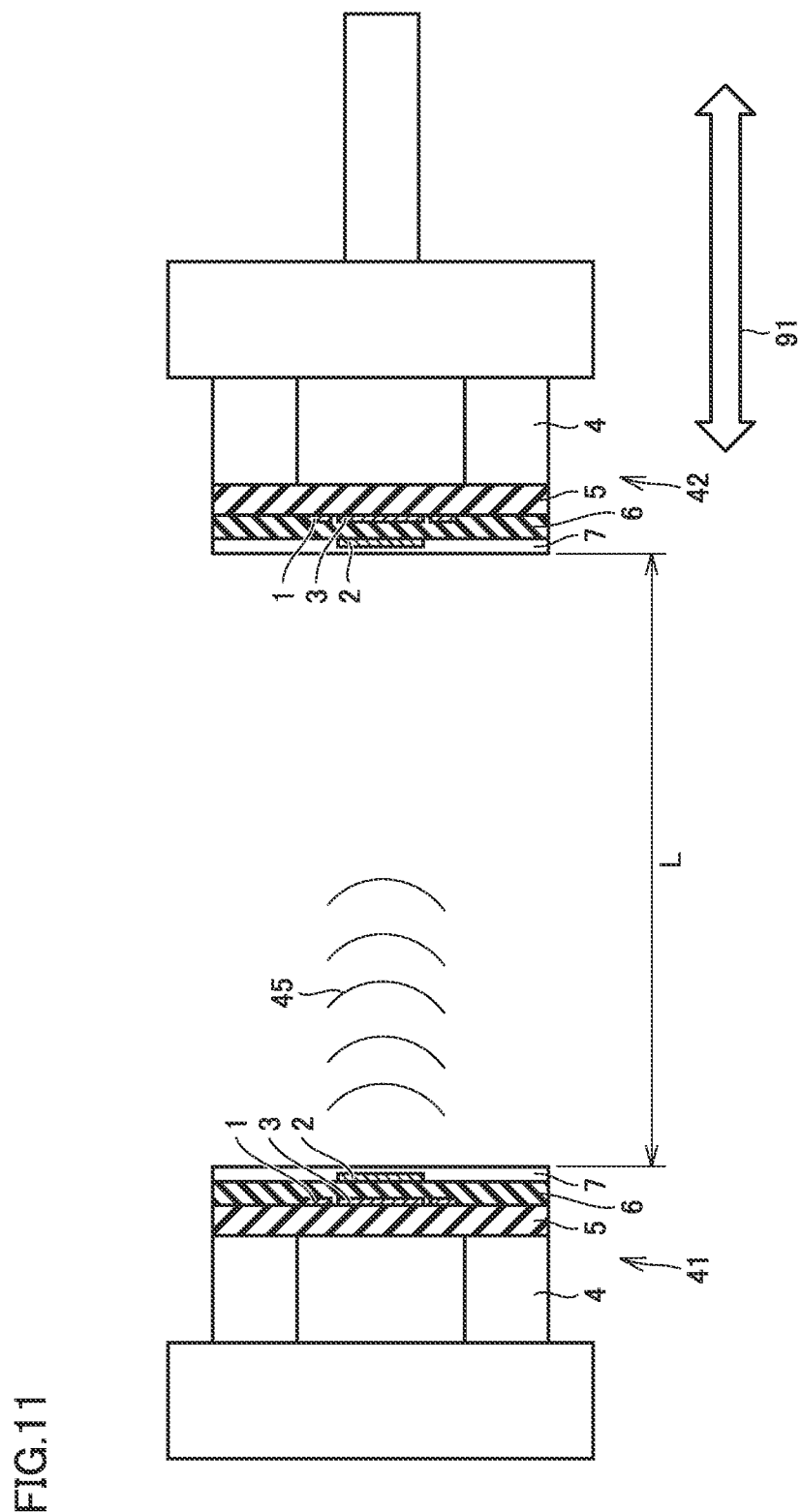
FIG. 11 is a diagram illustrating an example in which a piezoelectric device manufactured with a method for manufacturing a piezoelectric device in an exemplar embodiment 3 is used as a distance sensor.

Though Embodiments 1 and 2 show an example in which a piezoelectric device is used as a pMUT, in actual use of the pMUT, moisture may be attached due to condensation and the moisture may affect excitation or reception of ultrasonic waves. In this case, a heater used for lessening frequency variation is used to heat a membrane to 100 degrees or higher to thereby remove the moisture. Alternatively, the heater can also be used as a temperature sensor by measuring a resistance value of the heater electrode. Specifically, for example, when the heater is used as a distance sensor as shown in FIG. 11, the heater can be used for evaporating moisture attached to a surface. In FIG. 11, a transmission-side piezoelectric device 41 and a reception-side piezoelectric device 42 are combined to provide a distance sensor. Transmission-side piezoelectric device 41 and reception-side piezoelectric device 42 are each a piezoelectric device obtained with the manufacturing method as described in the embodiments above. Reception-side piezoelectric device 42 may be displaced as shown with an arrow 91. Ultrasonic waves 45 are emitted from transmission-side piezoelectric device 41 and received by reception-side piezoelectric device 42 to thereby measure a distance L.

In the present embodiment, heater 1 used in heat treatment can be used for a different application. For example, the heater can be used to remove moisture. Alternatively, heater 1 is used for maintaining a temperature of the piezoelectric device constant in consideration of temperature characteristics of the piezoelectric device. The heater can also be used as a temperature sensor for measuring a temperature of the piezoelectric device itself.

(Applications Other Than pMUT)

Though description is given in the embodiments above on the premise that a piezoelectric device is used as a pMUT, applications of the piezoelectric device are not limited to the pMUT. A technique for adjusting a resonance frequency can be used also in applications of a piezoelectric device as an RF filter and a MEMS oscillator.

(Modification of Structure of pMUT)

Though a pMUT configured such that heater 1 is arranged around an outer peripheral portion of membrane portion 17 is shown in the embodiments above, a piezoelectric device as the pMUT may also be configured otherwise, which will be described as Embodiments 4 to 7 below.

Embodiment 4

A method for manufacturing a piezoelectric device in an exemplary Embodiment 4 will be described with reference to FIGS. 12 and 13. FIG. 13 is a cross-sectional view along the line XIII-XIII in FIG. 12.

Figure 12:
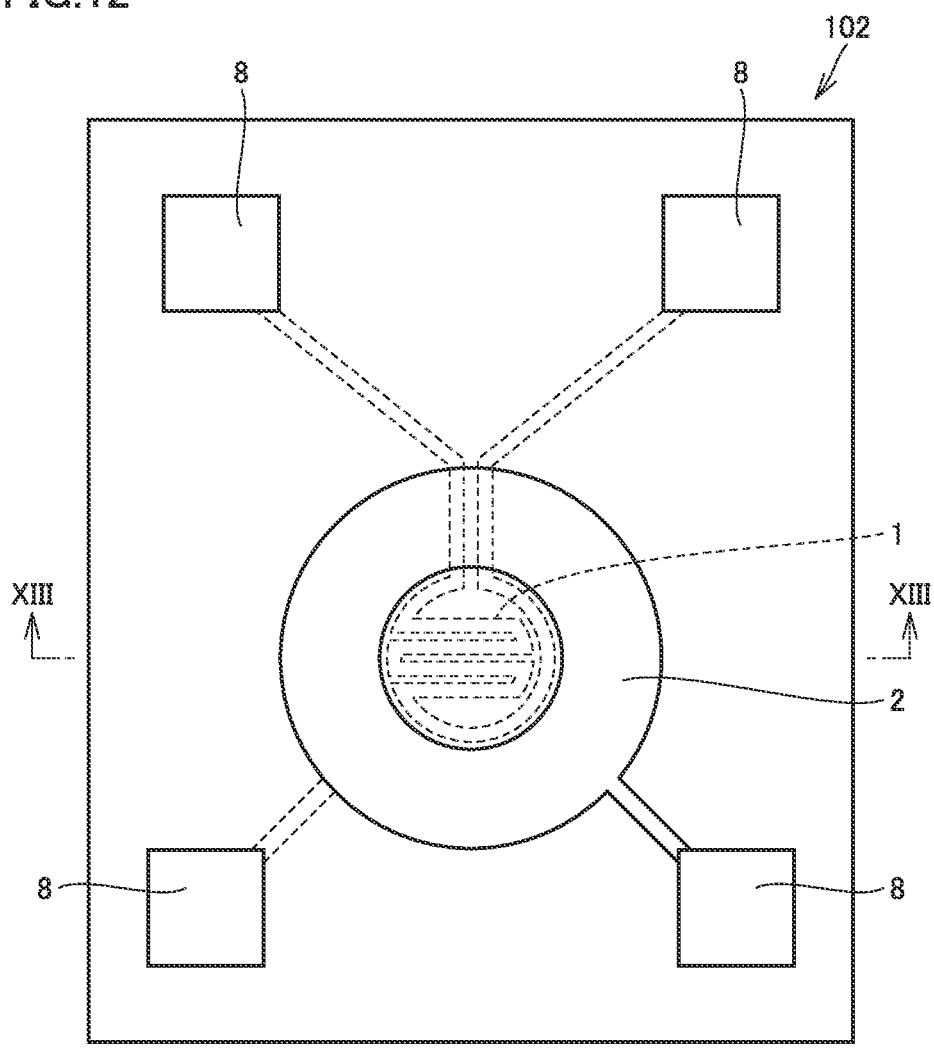
FIG. 12 is a plan view of a piezoelectric device manufactured with a method for manufacturing a piezoelectric device in an exemplar embodiment 4.
Figure 13:
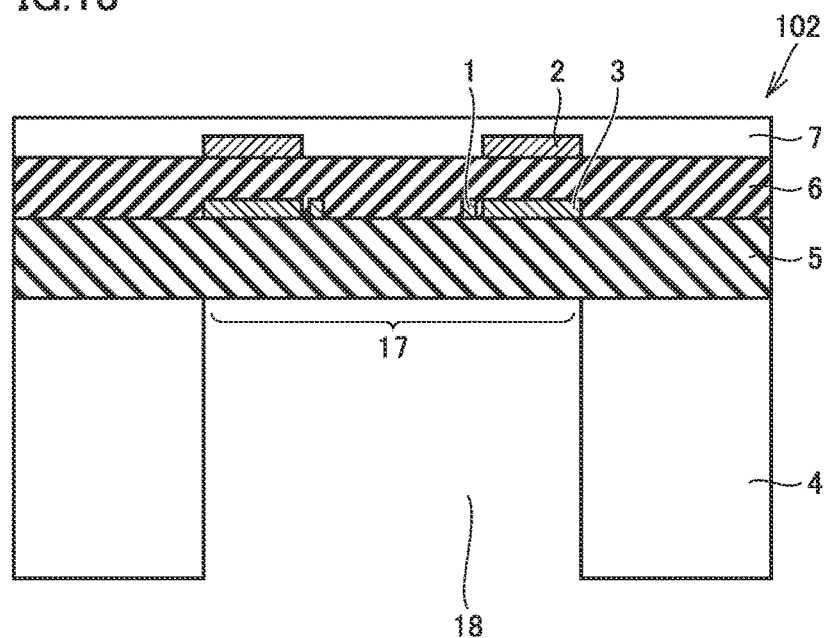
FIG. 13 is a cross-sectional view along the line XIII-XIII in FIG. 12.

For the sake of convenience of description, FIG. 12 shows a state with protective film 7 having been removed. Even while protective film 7 is provided, protective film 7 is provided with an opening over each pad portion 8 and electrical connection to pad portion 8 can be established even from above protective film 7. This is also applicable to Embodiments 5 to 7.

A piezoelectric device 102 is manufactured in the present embodiment. In piezoelectric device 102, as shown in FIG. 13, drive-and-reception upper electrode 2 and drive-and-reception lower electrode 3 are arranged to sandwich piezoelectric layer 6 around the outer peripheral portion of membrane portion 17. Heater 1 is arranged on the upper surface of support layer 5 in a central portion of membrane portion 17 as being surrounded by these electrodes. Preferably heater 1 includes a meandering portion.

The method for manufacturing a piezoelectric device in the embodiments described above can be adopted also in manufacturing a piezoelectric device as the thus configured pMUT. Heat treatment of membrane portion 17 can be performed by feeding electric power to heater 1 and frequency variation can be lessened.

Embodiment 5

Figure 14:
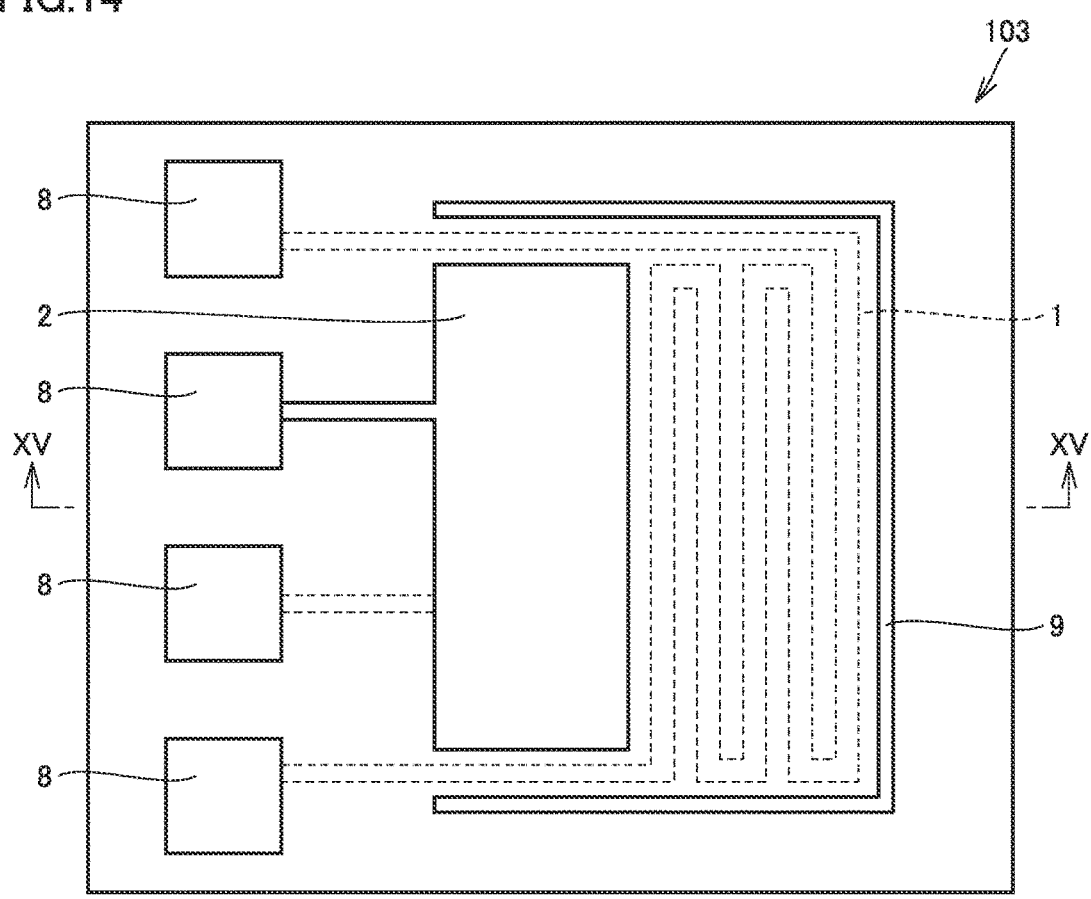
FIG. 14 is a plan view of a piezoelectric device manufactured with a method for manufacturing a piezoelectric device in an exemplar embodiment 5.
Figure 15:
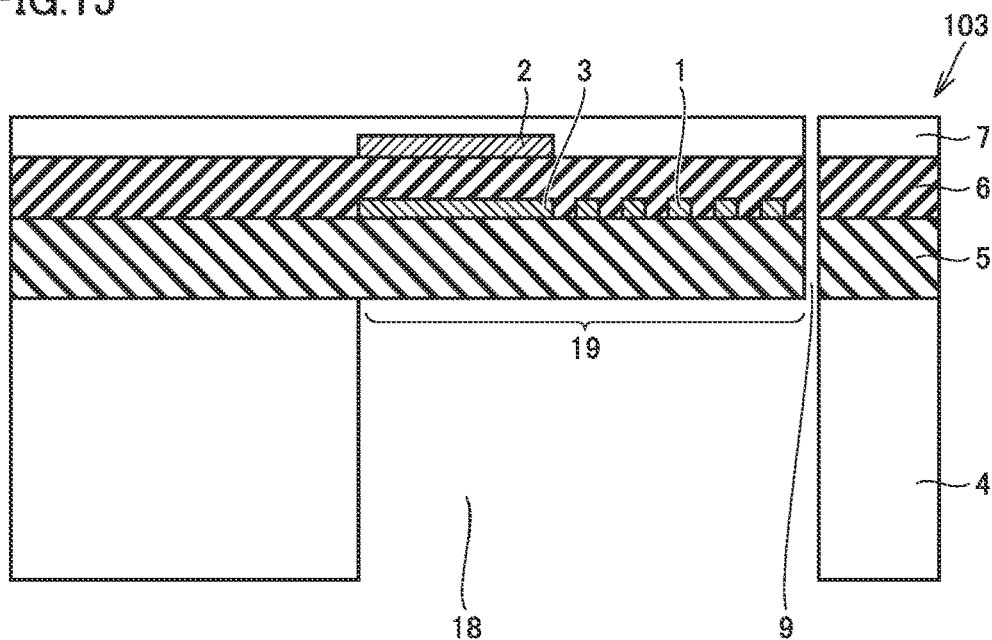
FIG. 15 is a cross-sectional view along the line XV-XV in FIG. 14.

A method for manufacturing a piezoelectric device in an exemplary Embodiment 5 will be described with reference to FIGS. 14 and 15. FIG. 15 is a cross-sectional view along the line XV-XV in FIG. 14.

A piezoelectric device 103 is manufactured in the present embodiment. In piezoelectric device 103, as shown in FIG. 14, a slit 9 is provided to provide a cantilever structure. Drive-and-reception upper electrode 2 and drive-and-reception lower electrode 3 are arranged to sandwich piezoelectric layer 6 in a portion on a root side of a cantilever portion 19. Heater 1 is arranged on the upper surface of support layer 5 in a portion on a tip end side of cantilever portion 19. Heater 1 includes a meandering portion. In the piezoelectric device having the cantilever structure, the cantilever portion is supported only in the portion on the root side. Therefore, a stress in the cantilever portion is released and frequency variation is generally less. The cantilever portion, however, may warp upward or downward or a degree of deformation may be different in the cantilever portion.

The method for manufacturing a piezoelectric device in the embodiments described above can be adopted also in manufacturing a piezoelectric device as the pMUT configured as described in the present embodiment. Heat treatment of cantilever portion 19 can be performed by feeding electric power to heater 1 and a degree of deformation can be lessened. As the degree of deformation is lessened, frequency variation can be lessened.

Embodiment 6

Figure 16:
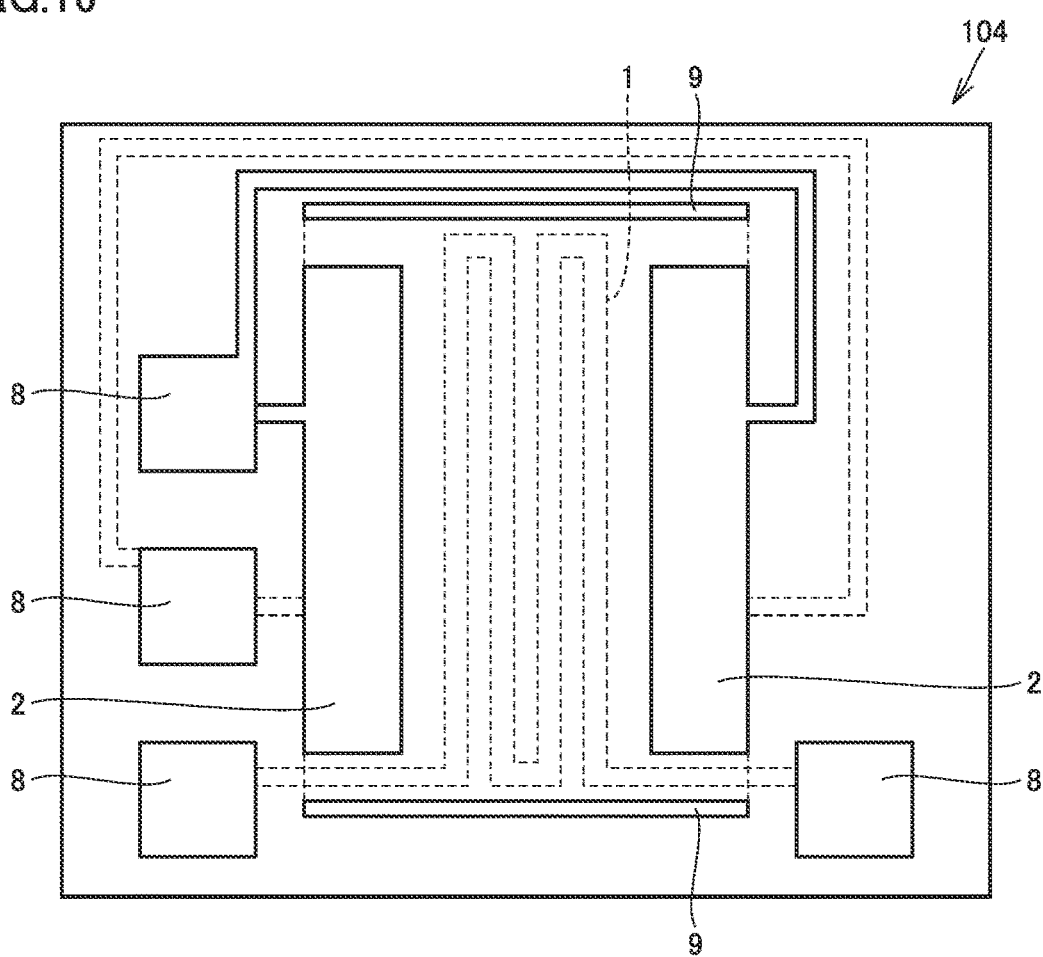
FIG. 16 is a plan view of a piezoelectric device manufactured with a method for manufacturing a piezoelectric device in an exemplar embodiment 6.

A method for manufacturing a piezoelectric device in an exemplary Embodiment 6 will be described with reference to FIG. 16.

A piezoelectric device 104 is manufactured in the present embodiment. In piezoelectric device 104, as shown in FIG. 16, two slits 9 are provided in parallel so that a double-supported beam structure is provided. Drive-and-reception upper electrode 2 and drive-and-reception lower electrode 3 are arranged to sandwich piezoelectric layer 6 in portions on root sides of a double-supported beam portion, that is, in a left end portion and a right end portion in FIG. 16. Heater 1 is arranged on the upper surface of support layer 5 in a central portion of the double-supported beam portion. Preferably, eater 1 includes a meandering portion.

The method for manufacturing a piezoelectric device in the embodiments described above can be adopted also in manufacturing a piezoelectric device as the thus configured pMUT. Heat treatment of the double-supported beam portion can be performed by feeding electric power to heater 1 and frequency variation can be lessened.

Embodiment 7

Figure 17:
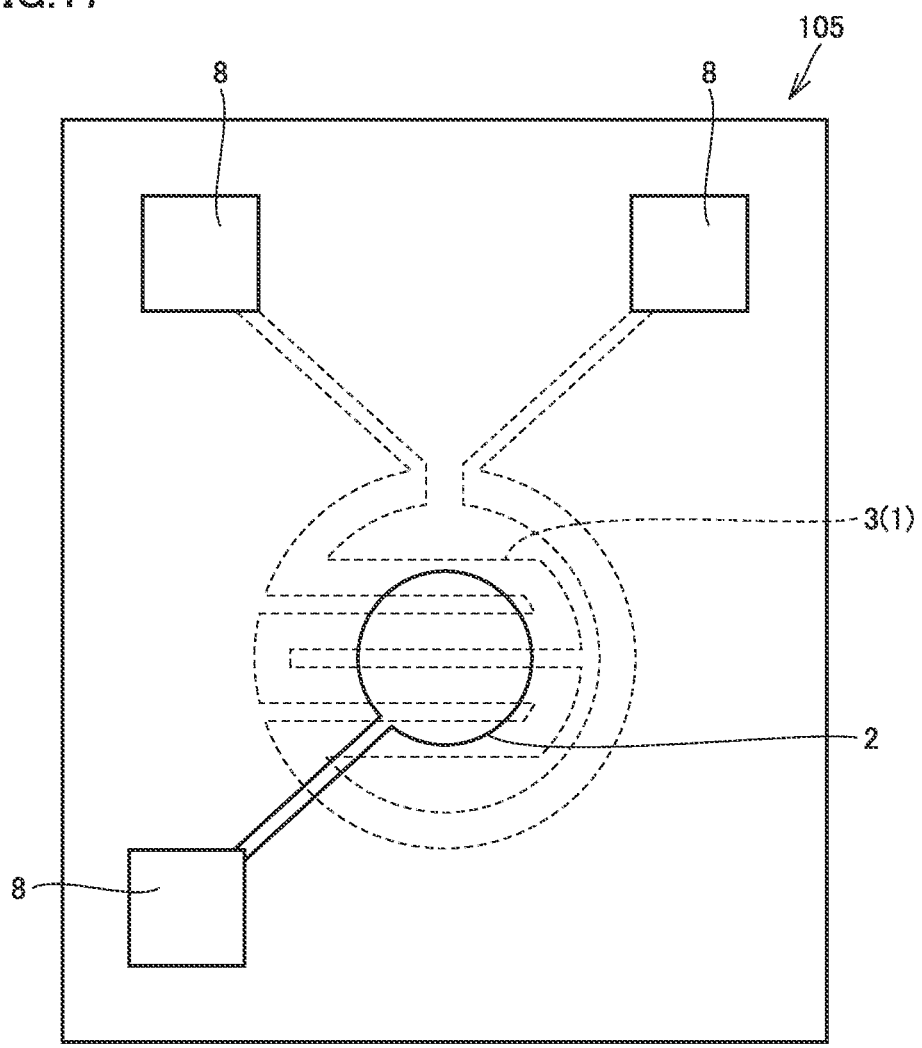
FIG. 17 is a plan view of a piezoelectric device manufactured with a method for manufacturing a piezoelectric device in an exemplar embodiment 7.

A method for manufacturing a piezoelectric device in an exemplary Embodiment 7 will be described with reference to FIG. 17.

A piezoelectric device 105 is manufactured in the present embodiment. Piezoelectric device 105 includes a membrane portion the same as shown in Embodiment 1. In piezoelectric device 105, as shown in FIG. 17, a wire formed as meandering on the upper surface of support layer 5 in the membrane portion serves as heater 1 and drive-and-reception lower electrode 3. Drive-and-reception upper electrode 2 is arranged as being superimposed on such an element serving as both of heater 1 and drive-and-reception lower electrode 3. Piezoelectric layer 6 lies between drive-and-reception upper electrode 2 and drive-and-reception lower electrode 3.

The method for manufacturing a piezoelectric device in the embodiments described above can be adopted also in manufacturing a piezoelectric device as the thus configured pMUT. Heat treatment of the membrane portion can be performed by feeding electric power to heater 1 and frequency variation can be lessened.

Embodiment 8

A method for manufacturing a piezoelectric device in an exemplary Embodiment 8 will be described with reference to FIGS. 18 and 19. FIG. 19 is a cross-sectional view along the line XIX-XIX in FIG. 18.

Figure 18:
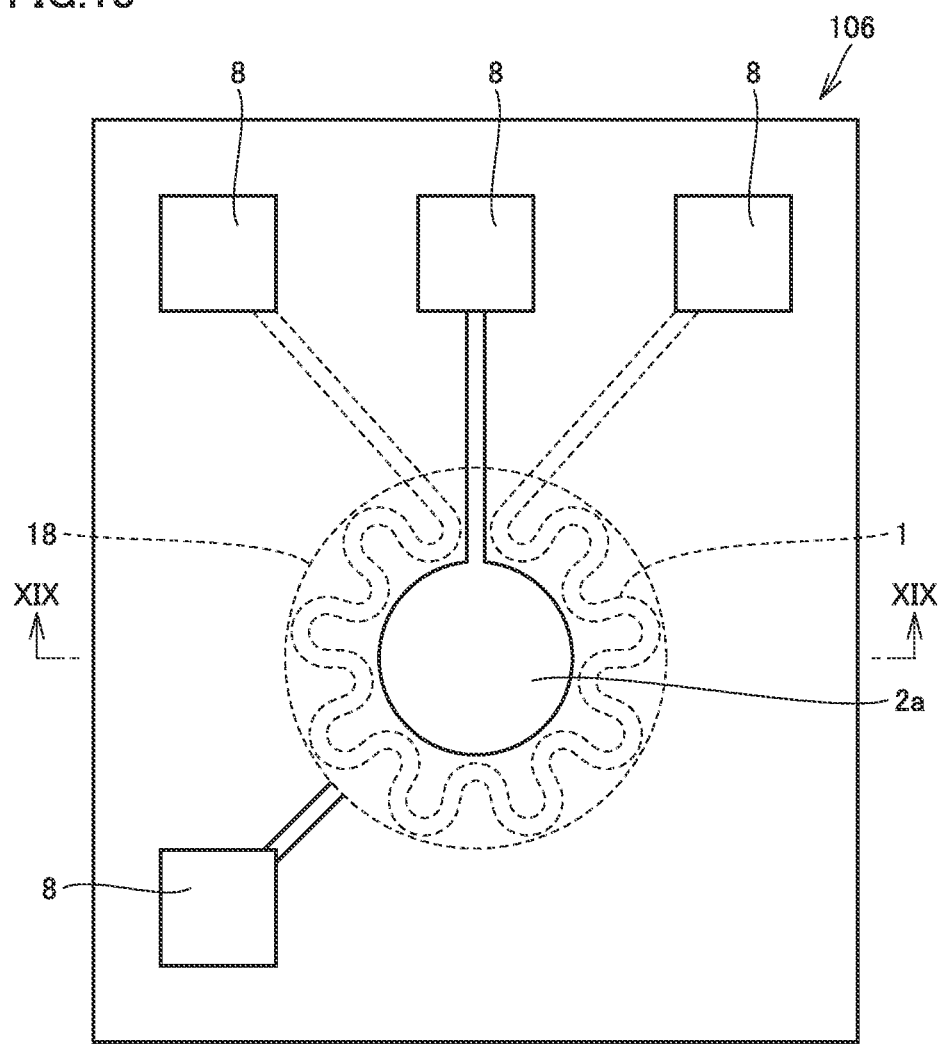
FIG. 18 is a plan view of a piezoelectric device manufactured with a method for manufacturing a piezoelectric device in an exemplar embodiment 8.
Figure 19:
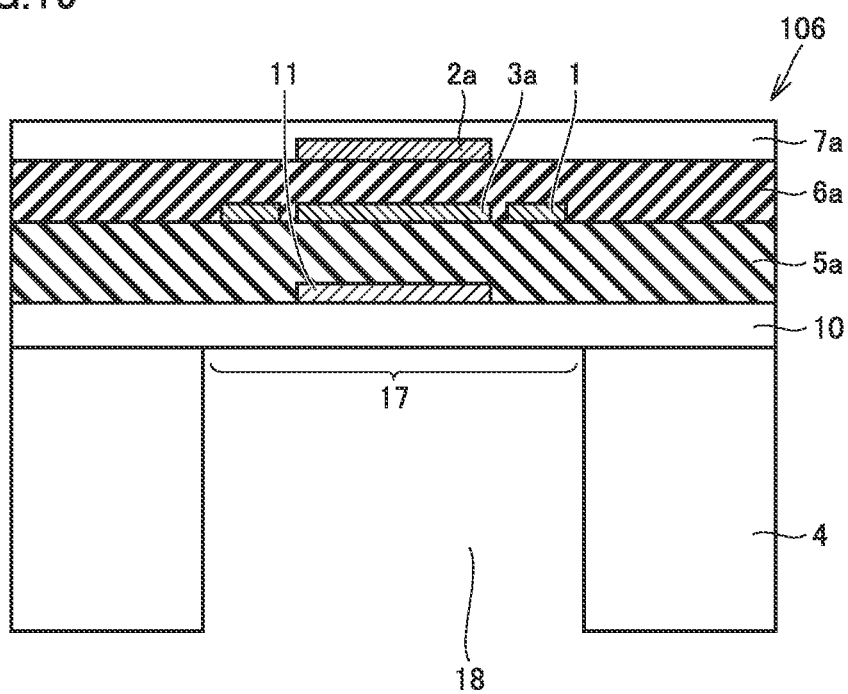
FIG. 19 is a cross-sectional view along the line XIX-XIX in FIG. 18.

For the sake of convenience of description, FIG. 18 shows a state with protective film 7 having been removed. Even while protective film 7 is provided, protective film 7 is provided with an opening over each pad portion 8 and electrical connection to pad portion 8 can be established even from above protective film 7. This is also applicable to Embodiments 9 and 10.

A piezoelectric device 106 is manufactured in the present embodiment. Though piezoelectric device 106 is similar to piezoelectric device 101 shown in Embodiment 1, piezoelectric device 106 has a bimorph structure unlike piezoelectric device 101. In piezoelectric device 106, a piezoelectric film has a two-layered structure and an electrode has a three-layered structure so as to be able to individually apply a voltage to each of these piezoelectric films. As shown in the cross-sectional view in FIG. 19, piezoelectric device 106 includes a first piezoelectric film 6a and a second piezoelectric film 5a as two piezoelectric films. Piezoelectric device 106 includes a drive-and-reception first electrode 2a, a drive-and-reception second electrode 3a, and a drive-and-reception third electrode 11 as three electrodes. These three electrodes occupy substantially the same area when viewed two-dimensionally. These three electrodes are spaced apart from one another in a direction of thickness.

Piezoelectric device 106 includes on substrate 4, a lower protective film 10, second piezoelectric film 5a, first piezoelectric film 6a, and an upper protective film 7a in this order. Drive-and-reception third electrode 11 is arranged between lower protective film 10 and second piezoelectric film 5a. Drive-and-reception third electrode 11 is formed on an upper surface of lower protective film 10. Drive-and-reception second electrode 3a and heater 1 are arranged between second piezoelectric film 5a and first piezoelectric film 6a. These are formed on an upper surface of second piezoelectric film 5a. Drive-and-reception first electrode 2a is arranged between first piezoelectric film 6a and upper protective film 7a. Drive-and-reception first electrode 2a is formed on an upper surface of first piezoelectric film 6a.

A lowermost surface of a portion exposed as membrane portion 17 is covered with lower protective film 10.

The method for manufacturing a piezoelectric device in the embodiments described above can be adopted also in manufacturing piezoelectric device 106 as the thus configured pMUT. Heat treatment of membrane portion 17 can be performed by feeding electric power to heater 1 and frequency variation can be lessened.

Embodiment 9

Figure 20:
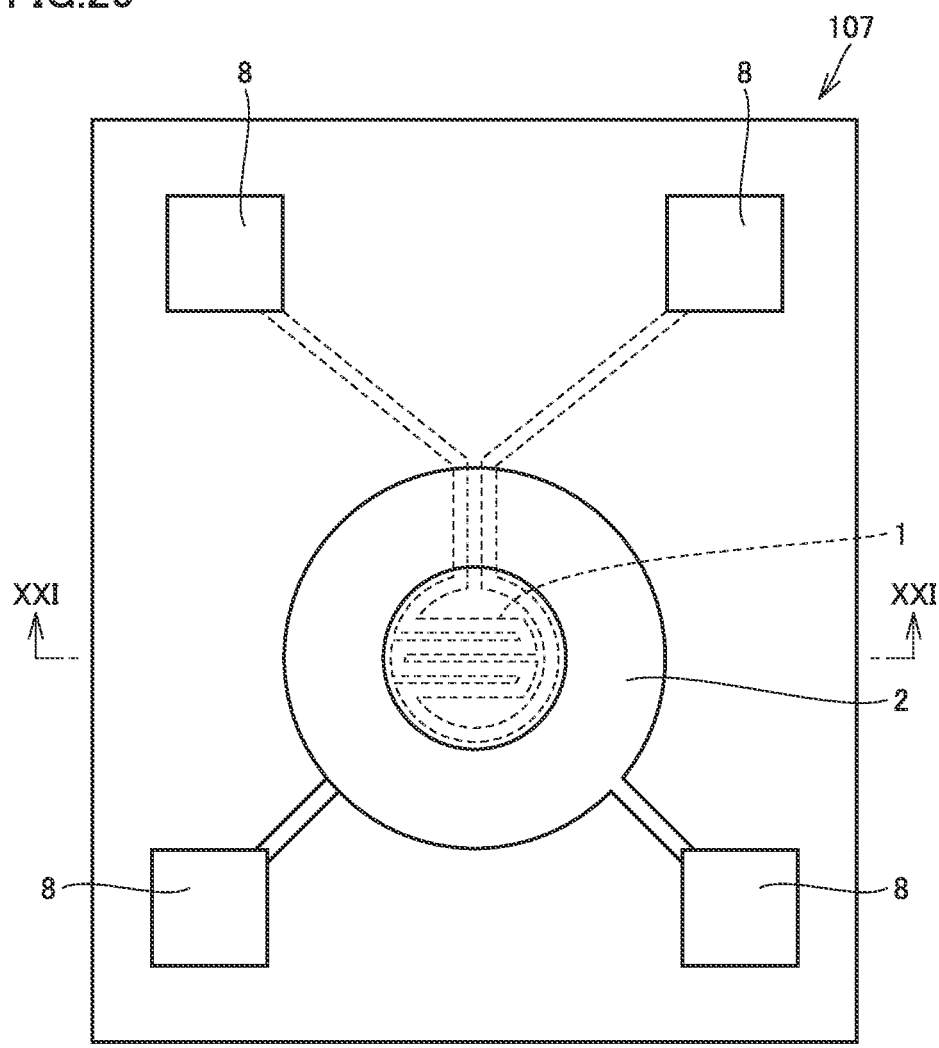
FIG. 20 is a plan view of a piezoelectric device manufactured with a method for manufacturing a piezoelectric device in an exemplar embodiment 9.
Figure 21:
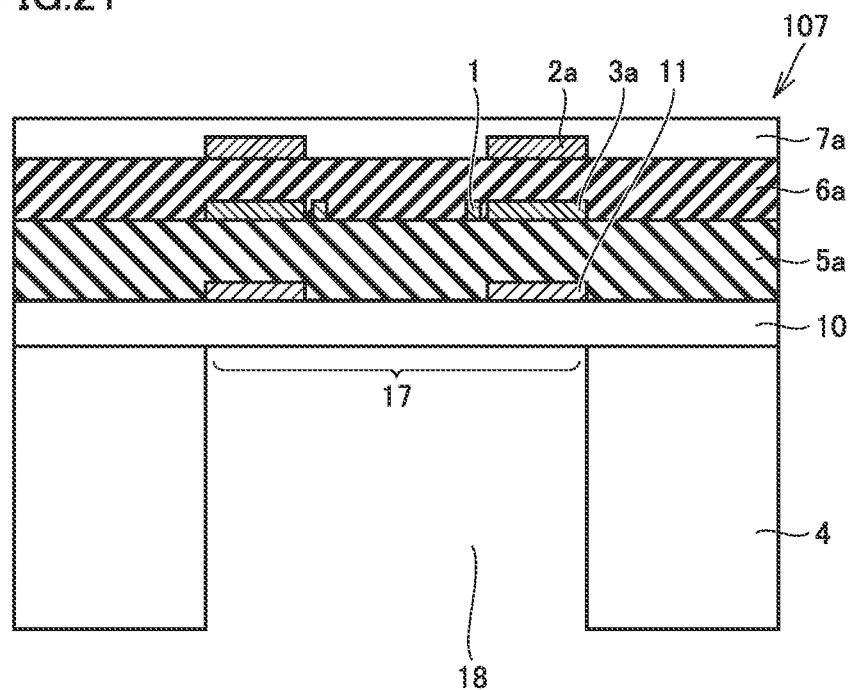
FIG. 21 is a cross-sectional view along the line XXI-XXI in FIG. 20.

A method for manufacturing a piezoelectric device in an exemplary Embodiment 9 will be described with reference to FIGS. 20 and 21. FIG. 21 is a cross-sectional view along the line XXI-XXI in FIG. 20.

A piezoelectric device 107 is manufactured in the present embodiment. Though piezoelectric device 107 is similar to piezoelectric device 102 shown in Embodiment 4, it has a bimorph structure unlike piezoelectric device 102. Details of the bimorph structure are the same as described in Embodiment 8.

The method for manufacturing a piezoelectric device in the embodiments described above can be adopted also in manufacturing piezoelectric device 107 as the thus configured pMUT. Heat treatment of membrane portion 17 can be performed by feeding electric power to heater 1 and frequency variation can be lessened.

Embodiment 10

Figure 22:
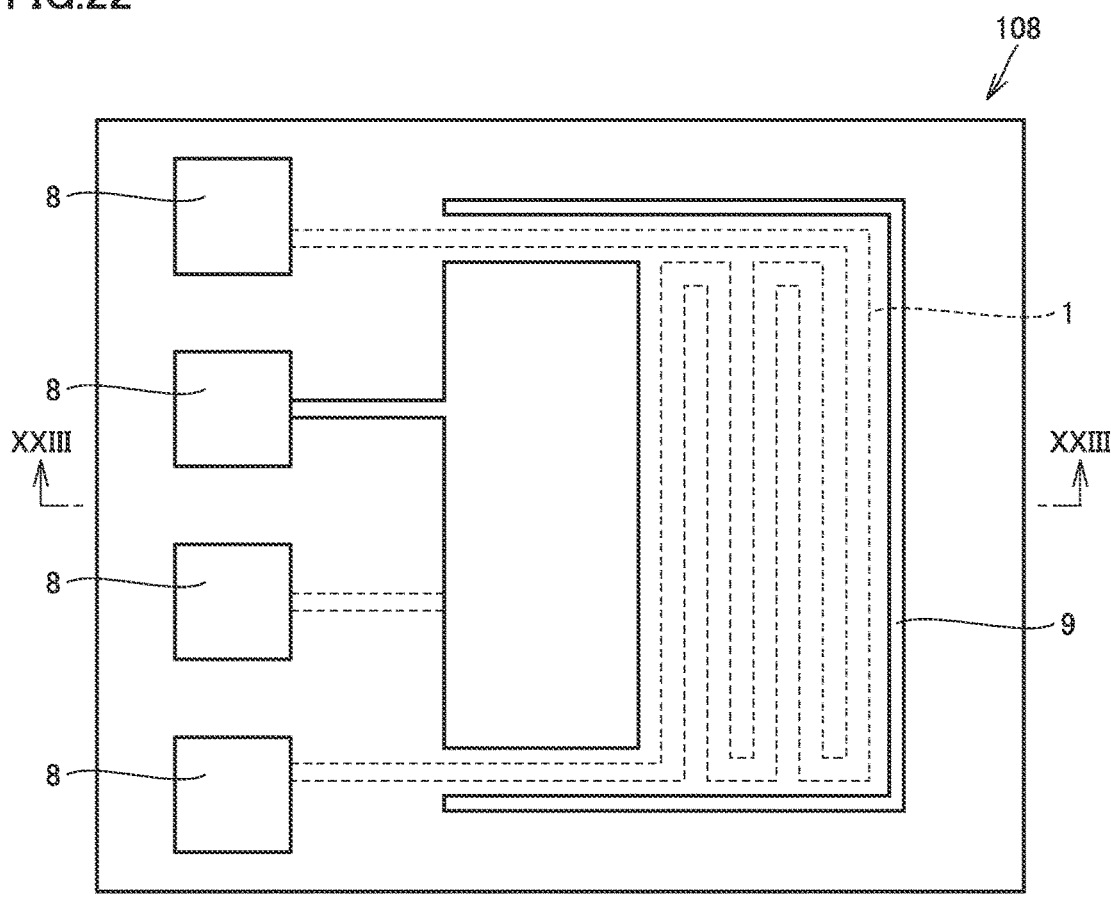
FIG. 22 is a plan view of a piezoelectric device manufactured with a method for manufacturing a piezoelectric device in an exemplar embodiment 10.
Figure 23:
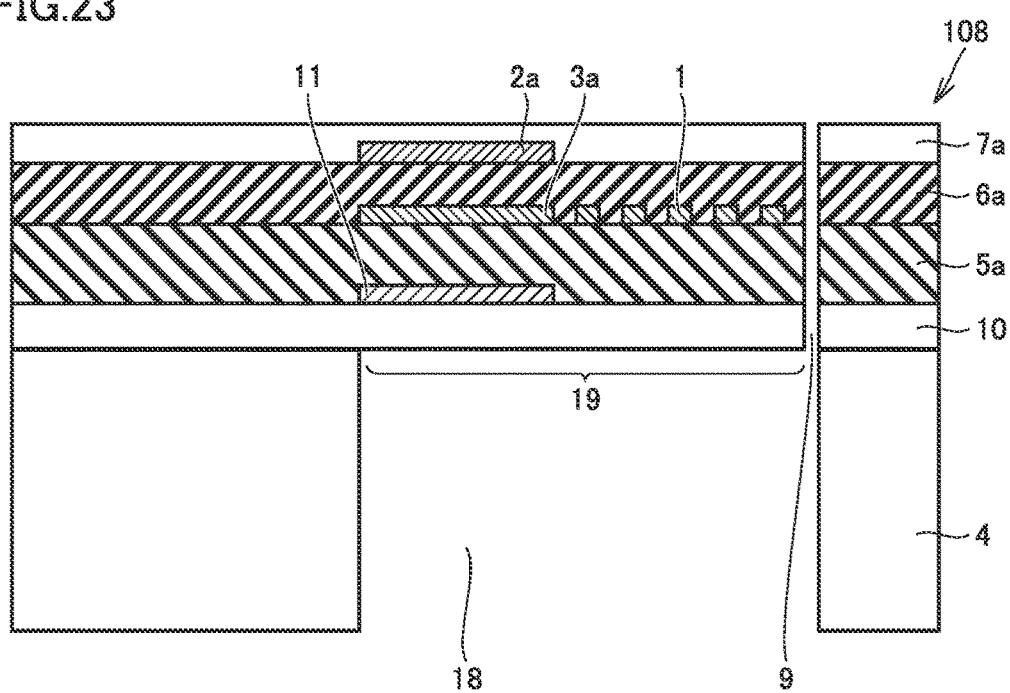
FIG. 23 is a cross-sectional view along the line XXIII-XXIII in FIG. 22.

A method for manufacturing a piezoelectric device in an exemplary Embodiment 10 will be described with reference to FIGS. 22 and 23. FIG. 23 is a cross-sectional view along the line XXIII-XXIII in FIG. 22.

A piezoelectric device 108 is manufactured in the present embodiment. Though piezoelectric device 108 is similar to piezoelectric device 103 shown in Embodiment 5, it has a bimorph structure unlike piezoelectric device 103. Details of the bimorph structure are the same as described in Embodiment 8.

The method for manufacturing a piezoelectric device in the embodiments described above can be adopted also in manufacturing piezoelectric device 108 as the thus configured pMUT. Heat treatment of cantilever portion 19 can be performed by feeding electric power to heater 1 and frequency variation can be lessened.

A plurality of the embodiments may be adopted as being combined as appropriate.

The embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 heater; 2 drive-and-reception upper electrode; 2a drive-and-reception first electrode; 3 drive-and-reception lower electrode; 3a drive-and-reception second electrode; 4 substrate; 5 support layer; 5a second piezoelectric film; 6 piezoelectric layer; 6a first piezoelectric film; 7 protective film; 7a upper protective film; 8 pad portion; 9 slit; 10 lower protective film; 11 drive-and-reception third electrode; 17 membrane portion; 18 through hole; 19 cantilever portion; 41 transmission-side piezoelectric device; 42 reception-side piezoelectric device; 45 ultrasonic wave; 91 arrow; 101, 102, 103, 104, 105, 106, 107, 108 piezoelectric device

The invention claimed is:

1. A method for manufacturing a piezoelectric device that exhibits out-of-plane vibration and that includes a substrate and a piezoelectric layer supported by the substrate, the method comprising:
   forming the piezoelectric layer above a surface the substrate;
   forming a heater and a heater electrode for driving the heater above the surface of the substrate; and
   feeding electric power to the heater electrode to apply a heat treatment to the piezoelectric device with heat generated from the heater driven by the heater electrode.

2. The method for manufacturing a piezoelectric device according to claim 1, further comprising:
   measuring a resonance frequency of the piezoelectric device; and
   driving the heater with a frequency adjusted based on the measuring of the resonance frequency to subject the piezoelectric device to the heat treatment.

3. The method for manufacturing a piezoelectric device according to claim 2, further comprising:

measuring the resonance frequency of the piezoelectric device subsequent to subjecting the piezoelectric device to the heat treatment; and adjusting the frequency for driving the heater based on the subsequent measuring of the resonance frequency of the piezoelectric device.

4. The method for manufacturing a piezoelectric device according to claim 1, further comprising:

forming at least a part of the piezoelectric layer as a membrane portion not superimposed on the substrate;

forming a lower electrode arranged under the piezoelectric layer at least in the membrane portion and an upper electrode arranged above the piezoelectric layer opposed to at least a part of the lower electrode with the piezoelectric layer being interposed in the membrane portion; and forming the heater in the membrane portion.

5. The method for manufacturing a piezoelectric device according to claim 4, further comprising forming a protective film to cover the upper electrode and the piezoelectric layer.

6. The method for manufacturing a piezoelectric device according to claim 5, wherein the protective film comprises AlN.

7. The method for manufacturing a piezoelectric device according to claim 1, further comprising forming a through hole or a recess in the substrate.

8. The method for manufacturing a piezoelectric device according to claim 7, further comprising providing the substrate with a support layer that covers the through hole or the recess, wherein the piezoelectric layer is supported by the substrate with the support layer being interposed therebetween.

9. The method for manufacturing a piezoelectric device according to claim 8, wherein the support layer comprises AlN.

10. The method for manufacturing a piezoelectric device according to claim 1, wherein the piezoelectric layer comprises at least one of the group consisting of AlN, KNN, and PZT.

11. The method for manufacturing a piezoelectric device according to claim 1, wherein the heater electrode comprises at least one of W and Mo.

12. The method for manufacturing a piezoelectric device according to claim 1, further comprising forming the heater and the heater electrode directly on the surface of the substrate with the piezoelectric layer covering the heater and the heater electrode.

* * * * *